(12) United States Patent
Akinaga et al.

(10) Patent No.: US 10,308,767 B2
(45) Date of Patent: Jun. 4, 2019

(54) ALKOXYSILANE-MODIFIED POLYAMIC ACID SOLUTION, LAMINATE AND FLEXIBLE DEVICE USING SAME, AND LAMINATE MANUFACTURING METHOD

(71) Applicant: KANEKA CORPORATION, Osaka-shi (JP)

(72) Inventors: Takahiro Akinaga, Otsu (JP); Yuki Takiguchi, Otsu (JP); Shinji Ozawa, Otsu (JP)

(73) Assignee: KANEKA CORPORATION, Osaka-shi (JP)

( * ) Notice: Subject to any disclaimer, the term of this patent is extended or adjusted under 35 U.S.C. 154(b) by 0 days.

(21) Appl. No.: 15/502,706

(22) PCT Filed: Jul. 15, 2015

(86) PCT No.: PCT/JP2015/070250
§ 371 (c)(1),
(2) Date: Feb. 8, 2017

(87) PCT Pub. No.: WO2016/024457
PCT Pub. Date: Feb. 18, 2016

(65) Prior Publication Data
US 2017/0233530 A1 Aug. 17, 2017

(30) Foreign Application Priority Data

Aug. 12, 2014 (JP) ................. 2014-164456

(51) Int. Cl.
| | | |
|---|---|---|
| C08G 73/10 | (2006.01) | |
| B32B 27/34 | (2006.01) | |
| B32B 27/28 | (2006.01) | |
| H05K 1/03 | (2006.01) | |
| H05K 3/00 | (2006.01) | |
| C09D 179/08 | (2006.01) | |

(52) U.S. Cl.
CPC ........ *C08G 73/1067* (2013.01); *B32B 27/281* (2013.01); *B32B 27/34* (2013.01); *C08G 73/1017* (2013.01); *C08G 73/1028* (2013.01); *C08G 73/1032* (2013.01); *C09D 179/08* (2013.01); *H05K 1/036* (2013.01); *H05K 1/0326* (2013.01); *H05K 1/0346* (2013.01); *H05K 1/0393* (2013.01); *H05K 3/007* (2013.01); *H05K 3/0011* (2013.01); *B32B 2457/00* (2013.01); *H05K 1/0306* (2013.01); *H05K 2201/0154* (2013.01); *H05K 2201/0162* (2013.01); *H05K 2203/0264* (2013.01)

(58) Field of Classification Search
CPC ............ C08G 73/1067; C08G 73/1032; B32B 27/281; H05K 3/0011; H05K 3/007; H05K 1/0393
USPC ........................................................ 428/216
See application file for complete search history.

(56) References Cited

U.S. PATENT DOCUMENTS

| | | | |
|---|---|---|---|
| 4,672,099 A * | 6/1987 | Kunimune | ........... C08G 73/106 525/431 |
| 4,868,584 A | 9/1989 | Nikaido et al. | |
| 4,996,293 A | 2/1991 | Tsuyoshi | |
| 5,063,115 A | 11/1991 | Merriman, Jr. | |
| 5,109,058 A | 4/1992 | Okinoshima et al. | |
| 5,346,979 A | 9/1994 | Okinoshima et al. | |
| 2002/0074686 A1* | 6/2002 | Yabuta | ................ B29C 47/0021 264/176.1 |
| 2009/0035454 A1 | 2/2009 | Fjelstad | |
| 2009/0068454 A1* | 3/2009 | Murakami | ............... B32B 15/08 428/337 |
| 2009/0197104 A1 | 9/2009 | Chen et al. | |
| 2010/0323161 A1 | 12/2010 | Chen et al. | |
| 2011/0124806 A1* | 5/2011 | Simmons | ........... C08G 73/1042 524/600 |
| 2013/0136934 A1 | 5/2013 | Iwai et al. | |
| 2013/0244000 A1 | 9/2013 | Chen et al. | |
| 2014/0042662 A1 | 2/2014 | Tamada et al. | |
| 2015/0368402 A1 | 12/2015 | Akinaga et al. | |

FOREIGN PATENT DOCUMENTS

| | | |
|---|---|---|
| CN | 101824159 A | 9/2010 |
| JP | 63-302069 A | 12/1988 |
| JP | 64-121 A | 1/1989 |
| JP | 64-69667 A | 3/1989 |
| JP | 3-243625 A | 10/1991 |
| JP | 7-94834 | 4/1995 |
| JP | 2551214 B2 | 11/1996 |
| JP | 2004-256418 A | 9/2004 |

(Continued)

OTHER PUBLICATIONS

Office Action dated Oct. 12, 2017 in U.S. Appl. No. 14/764,639, filed Jul. 30, 2015.
International Preliminary Report on Patentability dated Aug. 20, 2015 in PCT/JP2014/051943, filed Jan. 29, 2014.
International Search Report dated Apr. 8, 2014 in PCT/JP2014/051943, filed Jan. 29, 2014.
U.S. Final Office Action dated Mar. 9, 2018, in co-pending U.S. Appl. No. 14/764,639.
Office Action dated Jan. 9, 2018 in Japanese Patent Application No. 2014-560735 (with English translation) citing documents AO-AQ therein, 7 pages.
International Search Report dated Sep. 8, 2015 in PCT/JP2015/070250.

(Continued)

*Primary Examiner* — Tahseen Khan
(74) *Attorney, Agent, or Firm* — Oblon, McClelland, Maier & Neustadt, L.L.P.

(57) ABSTRACT

Provided are a polyamic acid solution that can be formed into a film without peeling even when the film is thick and can be stably stored at room temperature, and a laminate that can be suitably used for production of a flexible device. In the alkoxysilane-modified polyamic acid solution according to the present invention, an additive amount of an alkoxysilane compound that contains an amino group is more than 0.050 parts by weight and less than 0.100 parts by weight.

11 Claims, No Drawings

(56) References Cited

FOREIGN PATENT DOCUMENTS

| JP | 2006-7632 A | 1/2006 |
|---|---|---|
| JP | 2006-321229 A | 11/2006 |
| JP | 2007-203489 A | 8/2007 |
| JP | 2008-94927 A | 4/2008 |
| JP | 2009-294536 A | 12/2009 |
| JP | 2011-514266 A | 5/2011 |
| JP | 2012-35583 A | 2/2012 |
| JP | 2013-10340 | 1/2013 |
| TW | 222288 | 4/1994 |
| WO | WO 2011/145696 A1 | 11/2011 |
| WO | WO 2013/008822 | 1/2013 |
| WO | WO 2013/008906 | 1/2013 |
| WO | WO 2013/125193 A1 | 8/2013 |
| WO | WO 2013/125194 A1 | 8/2013 |
| WO | WO 2014/123045 A1 | 8/2014 |

OTHER PUBLICATIONS

International Preliminary Report on Patentability and Written Opinion dated Feb. 23, 2017.
Effects and Usage of Silane Coupling Agent (New Bound Edition) 2010, Science & Technology Co. Ltd., pp. 132-139 (with partial English translation).
NIKKEI FPD 2008, Trends and Strategies. vol. 1 Nikkei BP Ltd., 2008, pp. 144-151 (with partial English translation).
Advisory Action dated Jun. 18, 2018, in co-pending U.S. Appl. No. 14/764,639.

* cited by examiner

US 10,308,767 B2

ALKOXYSILANE-MODIFIED POLYAMIC ACID SOLUTION, LAMINATE AND FLEXIBLE DEVICE USING SAME, AND LAMINATE MANUFACTURING METHOD

TECHNICAL FIELD

The present invention relates to an alkoxysilane-modified polyamic acid solution, a laminate and a flexible device that use the alkoxysilane-modified polyamic acid solution, and a laminate manufacturing method.

TECHNICAL BACKGROUND

Currently, in the field of electronic devices such as flat panel displays and electronic papers, as substrates, glass substrates are mainly used. However, a glass substrate is heavy and fragile and thus is not necessarily an ideal substrate. Therefore, studies have been extensively conducted to realize a flexible device in which a glass substrate is replaced with a substrate made of a polymer material. However, many of the technologies for producing such flexible devices require new production techniques and equipment. Therefore, flexible devices using polymer materials have not yet mass-produced.

On the other hand, recently, as a shortcut for efficiently mass-producing flexible devices, it has been proposed to produce a flexible device using an ordinary process for a glass substrate by using a laminate that is obtained by forming a polyimide resin layer on a glass substrate (Non-Patent Document 1). In the process using the laminate, the flexible device is obtained by separating the polyimide resin layer from the glass substrate at a final stage.

In such a process, the laminate is required to have smoothness and low warpage for good handling. That is, the polyimide resin layer of the laminate needs to have a linear expansion coefficient that is about the same as that of glass. As a material of glass substrate, soda-lime glass and alkali-free glass are generally used. The soda-lime glass has a linear expansion coefficient of about 8-9 ppm/° C., and the alkali-free glass has a linear expansion coefficient of about 3-5 ppm/° C. Further, when an amorphous silicon thin film transistor is manufactured, temperature of the process reaches a maximum of 300-350° C. The linear expansion coefficient of a common polyimide is larger than that of glass. Therefore, materials suitable for such a process are limited in nature. For example, Patent Document 1 discloses a method in which a laminate is obtained by casting and thermally imidizing a polyimide precursor solution obtained from 3,3',4,4'-biphenyl-tetracarboxylic acid dianhydride and p-phenylenediamine or 4,4''-diamino-para-terphenyl on an inorganic substrate. On the other hand, when a polyimide precursor having a specific structure is formed into a film on an inorganic substrate and is further thermally imidized by raising temperature at a certain speed or faster, the polyimide film may peel off from the substrate. Therefore, for a purpose of improving adhesion between polyimide and an inorganic substrate, the inorganic substrate is subjected to a surface treatment (Non-Patent Document 2), or a silane coupling agent having an amino group or an acid anhydride group is added to a polyimide precursor solution (Patent Documents 2 and 3).

RELATED ART

Patent Document

[Patent Document 1] Japanese Patent Laid-Open Publication No. 2012-35583 (published on Feb. 23, 2012).
[Patent Document 2] Japanese Patent Laid-Open Publication No. Sho 63-302069 (published on Dec. 8, 1988).
[Patent Document 3] Japanese Patent No. 2551214 (registered on Aug. 22, 1996).

Non-Patent Document

[Non-Patent Document 1] Nikkei FPD 2008 vol. 1, Trend and Strategy, pages 144-151, Nikkei Business Publications, Inc. (2008).
[Non-Patent Document 2] Effect and Use of Silane Coupling Agent [New Edition], pages 132-139, Science & Technology Co., Ltd. (2010).

SUMMARY OF THE INVENTION

Problems to be Solved by the Invention

When a polyimide precursor of a specific structure having a low linear expansion coefficient as disclosed in Patent Document 1 is formed into a polyimide film on an inorganic substrate and is thermally imidized by raising temperature at a certain speed or faster, there is a problem that the polyimide film peels off from the inorganic substrate. In general, peeling becomes more likely to occur when the film before imidization is thicker. Therefore, when a laminate of a thick polyimide film and a glass substrate is produced, it is difficult to increase productivity. Further, when a polyamic acid is used as a polyimide precursor, since viscosity change is large when the polyamic acid is stored at normal temperature, it is necessary to store the polyamic acid at refrigeration temperature.

Among these problems, with respect to the peeling from the inorganic substrate, for a purpose of improving adhesion between the polyimide film and the inorganic substrate, it has been proposed to subject the inorganic substrate to a surface treatment or to add a silane coupling agent having an amino group or an acid anhydride group to a polyimide precursor solution. However, in the method of subjecting the inorganic substrate to a surface treatment as disclosed in Non-Patent Document 2, there is a problem of productivity reduction due to an increase in the number of processes. Further, in the method of adding a silane coupling agent to a polyamic precursor solution as disclosed in Patent Documents 2 and 3, in most cases, there is a problem that storage stability of the polyimide precursor solution is impaired.

The present invention is accomplished in view of the above-described situation, and is intended to provide a polyamic acid solution that can be formed into a film without peeling even when the film is thick and can be stably stored at room temperature, and to provide a laminate of a polyimide film and an inorganic substrate that can be suitably used for production of a flexible device, specifically, to provide a laminate of a polyimide film, which has a linear expansion coefficient of 1-10 ppm/° C., and an inorganic substrate.

Means for Solving the Problems

A structure of the present invention is as follows. An alkoxysilane-modified polyamic acid solution according to the present invention is obtained by causing an alkoxysilane compound, which contains an amino group, and a polyamic acid to react in a solution. The polyamic acid is obtained by causing aromatic diamine and aromatic tetracarboxylic acid dianhydride to react in a solvent. A molar ratio obtained by dividing a total number of moles of the aromatic tetracarboxylic acid dianhydride by a total number of moles of the aromatic diamine is 0.980 or more and 0.9995 or less. When an amount of polyamic acid contained in the alkoxysilane-modified polyamic acid solution is 100 parts by weight, an additive amount of the alkoxysilane compound is more than 0.050 parts by weight and less than 0.100 parts by weight.

In the alkoxysilane-modified polyamic acid solution according to the present invention, a water content of the alkoxysilane-modified polyamic acid solution may be 500 ppm or more and 3000 ppm or less.

In the alkoxysilane-modified polyamic acid solution according to the present invention, the aromatic tetracarboxylic acid dianhydride may be 3,3',4,4'-biphenyl-tetracarboxylic acid dianhydride, and the aromatic diamine may be aromatic diamine represented by the following Formula (1).

[Chemical Formula 1]

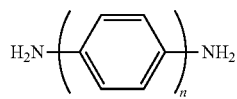

(1)

(where n is an integer of 1-3).

In the alkoxysilane-modified polyamic acid solution according to the present invention, a main component of the solvent may be an amide solvent.

A laminate manufacturing method according to the present invention includes a process in which a laminate is obtained by laminating a polyimide film on an inorganic substrate, the polyimide film being obtained from the alkoxysilane-modified polyamic acid solution according to the present invention by casting and thermally imidizing the alkoxysilane-modified polyamic acid solution on the inorganic substrate.

A flexible device manufacturing method according to the present invention includes: a process of forming an electronic element on a polyimide film of a laminate obtained using the laminate manufacturing method according to the present invention; and a process of peeling the polyimide film, on which the electronic element is formed, from an inorganic substrate of the laminate.

A laminate according to the present invention includes: a polyimide film that is obtained from the alkoxysilane-modified polyamic acid solution according to the present invention; and an inorganic substrate on which the polyimide film is laminated. The polyimide film has a linear expansion coefficient of 1-10 ppm/° C.

In the laminate according to the present invention, the inorganic substrate may have a thickness of 0.4-5.0 mm, and the polyimide film may have a thickness of 10-50 μm.

A flexible device according to the present invention includes: a polyimide film that is obtained from the alkoxysilane-modified polyamic acid solution according to the present invention; and an electronic element that is formed on the polyimide film.

An alkoxysilane-modified polyamic acid solution manufacturing method according to the present invention includes: a process in which a polyamic acid is obtained by causing aromatic diamine and aromatic tetracarboxylic acid dianhydride to react in a solvent; and a process in which an alkoxysilane-modified polyamic acid solution is obtained by causing an alkoxysilane compound, which contains an amino group, and the polyamic acid to react in a solution. A molar ratio obtained by dividing a total number of moles of the aromatic tetracarboxylic acid dianhydride by a total number of moles of the aromatic diamine is 0.980 or more and 0.9995 or less. When an amount of polyamic acid contained in the alkoxysilane-modified polyamic acid solution is 100 parts by weight, an additive amount of the alkoxysilane compound is more than 0.050 parts by weight and less than 0.100 parts by weight.

Effect of the Invention

According to the present invention, when an alkoxysilane-modified polyamic acid solution, in which some of terminal groups of polyamic acid are modified by alkoxysilane, is used to produce a polyimide film by applying the solution on an inorganic substrate and applying heat thereto, peeling (delamination, foaming) of the polyimide film from the inorganic substrate can be suppressed.

Further, in an alkoxysilane-modified polyamic acid solution that has been adjusted such that most of terminal groups of the polyamic acid become amino groups, when decomposition occurs, amide bonds are likely to be formed. Therefore, a molecular weight of the alkoxysilane-modified polyamic acid solution is less likely to change, and viscosity change during varnish storage can be suppressed.

MODE FOR CARRYING OUT THE INVENTION

In the following, the present invention is described in detail. However, these are one aspect of the present invention, and the present invention is not limited to these contents. In the present specification, unless otherwise specified, "A-B" representing a numerical range means "A or more and B or less."

<Alkoxysilane-Modified Polyamic Acid Solution>

An alkoxysilane-modified polyamic acid solution of the present invention (hereinafter also simply referred to as the "solution") is obtained by causing an alkoxysilane compound, which contains an amino group, and a polyamic acid to react in a solution. The polyamic acid is obtained by causing aromatic diamine and aromatic tetracarboxylic acid dianhydride to react in a solvent.

A raw material and a polymerization method of the polyamic acid will be described later. However, in the present invention, for a purpose of improving storage stability, it is necessary that a ratio that terminal groups of the polyamic acid are occupied by amino groups be larger than a ratio that terminal groups of the polyamic acid are occupied by carboxyl groups.

Modification by an alkoxysilane compound containing an amino group is performed by adding an alkoxysilane compound containing an amino group to a polyamic acid solution, which is obtained by dissolving a polyamic acid in a solvent, and causing the alkoxysilane compound containing an amino group and the polyamic acid to react. Examples of the alkoxysilane compound containing an amino group include 3-aminopropyltrimethoxysilane, 3-aminopropyltriethoxysilane, 3-aminopropylmethyldimethoxysilane, 3-aminopropylmethyldiethoxysilane, 3-(2-aminoethyl)aminopropyltrimethoxysilane, 3-phenylaminopropyltrimethoxysilane, 2-aminophenyltrimethoxysilane, 3-aminophenyltrimethoxysilane, and the like. Among these, as alkoxysilane compounds containing an amino group, alkoxysilane compounds containing a primary amino group are preferable. When the alkoxysilane compound containing an amino group is an alkoxysilane compound containing a primary amino group, the alkoxysilane compound can suitably react with the polyamic acid.

A mixing ratio of the alkoxysilane compound containing these amino groups with respect to 100 parts by weight of the polyamic acid is more than 0.050 parts by weight and less than 0.100 parts by weight. From a point of view of suppressing viscosity change during varnish storage, it is more preferable that the mixing ratio of the alkoxysilane compound containing an amino group with respect to 100 parts by weight of the polyamic acid be more than 0.050 parts by weight and equal to or less than 0.099 parts by weight, or be more than 0.050 parts by weight and equal to or less than 0.095 parts by weight, or be more than 0.050 parts by weight and equal to or less than 0.090 parts by weight. The lower limit of the mixing ratio of the alkoxysilane compound containing an amino group with respect to 100 parts by weight of the polyamic acid may be 0.051 parts by weight or more, or may be 0.055 parts by weight or more, or may be 0.060 parts by weight or more.

When the mixing ratio of the alkoxysilane compound containing an amino group is more than 0.050 parts by weight, an effect of suppressing peeling of a polyimide film from an inorganic substrate is sufficiently achieved. When the mixing ratio of the alkoxysilane compound containing an amino group is less than 0.100 parts by weight, a molecular weight of the polyamic acid is sufficiently kept, and thus, a problem such as embrittlement of the polyimide film does not occur. Further, when the mixing ratio of the alkoxysilane compound containing an amino group is less than 0.100 parts by weight, viscosity change after the alkoxysilane compound is added is also small. Further, when an amount of an unreacted component is large, the unreacted component gradually reacts with the polyamic acid causing viscosity of the polyamic acid solution to decrease, or the alkoxysilane condenses causing the polyamic acid solution to turn into a gel. By keeping a minimum necessary additive amount of the alkoxysilane compound having an amino group, unnecessary side reactions such as reduction in viscosity and gelation during varnish storage can be suppressed while suppressing peeling of the polyimide film from the inorganic substrate.

When an alkoxysilane compound containing an amino group is added to a polyamic acid of which most terminal groups are amino groups, viscosity of the polyamic acid solution decreases. The inventors presume that this is because an acid anhydride group regenerated when an amide bond in the polyamic acid dissociates reacts with the amino group of the alkoxysilane compound, and a modification reaction progresses and the molecular weight of the polyamic acid decreases. From a point of view of allowing the modification reaction to easily proceed while suppressing a reaction between the acid anhydride group and water, reaction temperature is preferably 0° C. or higher and 80° C. or lower, and more preferably 20° C. or higher and 60° C. or lower.

Although also depending on a type and concentration of the polyamic acid, since concentration of the acid dianhydride is low, the modification reaction is slow, and when the reaction temperature is low, it may take about five days for the viscosity to become constant. When the type of the polyamic acid and/or the solvent are different, viscosity change with time is recorded for each reaction temperature, and an appropriate reaction temperature may be selected.

In this way, when the polyamic acid solution obtained by modifying some of the terminal groups thereof by alkoxysilane is applied on an inorganic substrate, peeling (delamination, foaming) of the polyimide film obtained by heating can be suppressed. Further, by adjusting such that most of the terminal groups of the polyamic acid become amino groups, even when decomposition of the alkoxysilane-modified polyamic acid solution occurs, amide bonds are likely to be formed. Therefore, the molecular weight is unlikely to change, and viscosity change during varnish storage can be suppressed.

<Raw Material of Polyamic Acid>

As describe above, aromatic tetracarboxylic acid dianhydride and aromatic diamine are used as a raw material of the polyamic acid.

In order to obtain a laminate of a polyimide film having a linear expansion coefficient of 1-10 ppm/° C. and an inorganic substrate, it is preferable to mainly use 3,3',4,4'-biphenyl-tetracarboxylic acid dianhydride (hereinafter, may be abbreviated as BPDA) as the aromatic tetracarboxylic acid dianhydride, and it is preferable to mainly use aromatic diamine represented by the following Formula (1) as the aromatic diamine.

[Chemical Formula 2]

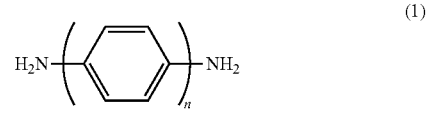

(1)

(where n is an integer of 1-3).

Aromatic diamines of Formula (1) are p-phenylenediamine (hereinafter, may be abbreviated as PDA), 4,4'-diaminobenzidine, and 4,4''-diamino-para-terphenyl (hereinafter, may be abbreviated as DATP). Among these aromatic diamines, from a point of view of availability, PDA and DATP are preferable.

It is preferable that the aromatic tetracarboxylic acid dianhydride be 3,3',4,4'-biphenyl-tetracarboxylic acid dianhydride. By using an alkoxysilane-modified polyamic acid solution containing 3,3',4,4'-biphenyl-tetracarboxylic acid dianhydride and highly linear aromatic diamine such as p-phenylenediamine as aromatic diamine, suitable characteristics such as a low CTE can be imparted to a flexible device substrate.

Further, within a scope such that the characteristics of the present invention are not impaired, aromatic diamine other than PDA, 4,4'-diaminobenzidine and DATP may be used, and aromatic tetracarboxylic acid dianhydride other than 3,3',4,4'-biphenyl-tetracarboxylic acid dianhydride may be used. For example, the following aromatic tetracarboxylic acid dianhydride and/or aromatic diamine may each be used in combination at 5 mol % or less with respect to the whole raw material of polyamic acid.

Examples of aromatic tetracarboxylic acid dianhydride include pyromellitate acid dianhydride, 3,3',4,4'-benzophenone tetracarboxylic acid dianhydride, 2,3,3',4'-biphenyl-tetracarboxylic acid dianhydride, 3,3',4,4'-diphenylsulfone tetracarboxylic acid dianhydride, 1,4,5,8-naphthalene tetracarboxylic acid dianhydride, 2,3,6,7-naphthalene tetracarboxylic acid dianhydride, 1,2,5,6-naphthalenete tracarboxylic acid dianhydride, 4,4'-oxydiphthalic acid anhydride, 9,9-bis(3,4-dicarboxyphenyl) fluorene dianhydride, 9, 9'-bis [4-(3,4-dicarboxyphenoxy) phenyl] fluorene dianhydride, 3,3',4,4'-biphenyl ether tetracarboxylic acid dianhydride, 2,3,5,6-pyridine tetracarboxylic acid dianhydride, 3,4,9,10-perylene tetracarboxylic acid dianhydride, 4,4'-sulfonyl diphthalic acid dianhydride, para-terphenyl-3,4,3',4'-tetracarboxylic acid dianhydride, meta-terphenyl-3,3',4,4'-tetracarboxylic acid dianhydride, 3,3',4,4'-diphenyl ether tetracarboxylic acid dianhydride, and the like. An aromatic ring of the acid dianhydride may have an alkyl group and/or halogen substituted group.

Examples of aromatic diamine include 4,4'-diaminodiphenyl ether, 3,4'-diaminodiphenyl ether, 4,4'-diaminodiphenyl sulfone, 1,5-(4-aminophenoxy) pentane, 1,3-bis(4-aminophenoxy)-2,2-dimethylpropane, 2,2-bis(4-aminophenoxyphenyl) propane, bis[4-(4-aminophenoxy) phenyl] sulfone, bis[4-(3-aminophenoxy) phenyl] sulfone, and the like.

<Polymerization Method of Polyamic Acid>

The polyamic acid used in the present invention can be produced by solution polymerization. That is, one kind or two or more kinds of aromatic tetracarboxylic acid dianhydride and one kind or two or more kinds of aromatic diamine as raw materials are used such that a molar ratio of aromatic diamine is higher than that of a carboxyl group, and are polymerized in an organic polar solvent, and thereby a polyamic acid solution, which is a polyimide precursor, is obtained.

A molar ratio obtained by dividing a total number of moles of aromatic tetracarboxylic acid dianhydride by a total number of moles of aromatic diamine is preferably 0.980 or more and 0.9995 or less, and more preferably 0.995 or more and 0.998 or less. By setting the molar ratio to 0.9995 or less, a ratio that terminal groups of polyamic acid are occupied by amino groups becomes higher than a ratio that terminal groups of polyamic acid are occupied by acid anhydride groups, and storage stability can be improved. This effect is further improved by decreasing the molar ratio, but is not significantly improved when the molar ratio is 0.998 or less. On the other hand, in order to obtain a strong polyimide film, it is necessary for the molar ratio to be close to 1.000 to sufficiently increase the molecular weight. When the molar ratio is 0.980 or more, a strong polyimide film excellent in tensile strength can be obtained. Further, preferably, the molar ratio is set to 0.998 or more to be prepared for reduction in molecular weight during storage or during imidization. The tensile strength is evaluated using a test method for tensile characteristics described in JIS K7127: 1999.

A preferred solvent for synthesizing the polyamic acid is an amide solvent, that is, N,N-dimethylformamide, N,N-dimethylacetamide, N-methyl-2-pyrrolidone, or the like. By suitably selecting and using a solvent, characteristics of the polyamic acid solution and characteristics of the polyimide film after imidization on the inorganic substrate can be controlled. It is preferable that a main component of the solvent be an amide solvent. For example, when a total amount of the solvent is 100 parts by weight, an amount of the amide solvent is preferably 50-100 parts by weight, and more preferably 70-100 parts by weight.

In the studies of the present inventors, when N,N-dimethylacetamide is used as the solvent, the storage stability of the polyamic acid deteriorates and the linear expansion coefficient of the polyimide film increases. When N-methyl-2-pyrrolidone is used as the solvent, the storage stability of the polyamic acid solution is high and the linear expansion coefficient of the polyimide film is lower. With regard to the storage stability, when N-methyl-2-pyrrolidone is used, better characteristics are obtained. However, with regard to characteristics such as the linear expansion coefficient, it does not mean that either one is better than the other. For example, a suitable solvent is to be selected for each intended purpose such as that N-methyl-2-pyrrolidone is used when a harder polyimide film is preferred, and N,N-dimethylacetamide is used when a soft polyimide film is preferred.

It is preferable that a temperature adjustment device for controlling the reaction temperature be provided in a reaction device. The reaction temperature when the polyamic acid is polymerized is preferably 0° C. or more and 80° C. or less, and is more preferably 20° C. or more and 60° C. or less from a point of view that dissociation of amide bonds, which is a reverse reaction of polymerization, is suppressed and the viscosity of the polyamic acid is likely to increase.

Further, a heat treatment may be performed for 1-24 hours at a temperature of about 70-90° C. for a purpose of adjusting the viscosity, that is, the molecular weight, after the polymerization. This is an operation that is conventionally referred to as cooking, and, by performing the heat treatment, it is intended to promote dissociation of amic acid and deactivation of acid dianhydride due to a reaction with water in the system, and to make the viscosity of the polyamic acid solution suitable for a subsequent operation. Since unreacted aromatic tetracarboxylic acid dianhydride tends to be easily deactivated, it is preferable to separately perform the polymerization reaction and the cooking. However, it is also possible that the reaction temperature is set to 70-90° C. from the beginning and the polymerization reaction and the cooking are performed at once.

With regard to a weight percentage of the polyamic acid in the polyamic acid solution, the polyamic acid dissolved in the organic solvent is preferably 5-30 wt %, more preferably 8-25 wt %, and even more preferably 10-20 wt %. That the weight percentage of the polyamic acid is within the above range is preferable in that gelation due to abnormal polymerization of undissolved raw materials can be suppressed and the viscosity of the polyamic acid is likely to rise.

<Water Content of Alkoxysilane-Modified Polyamic Acid Solution>

The water content in all alkoxysilane-modified polyamic acid solutions so far is preferably 500 ppm or more and 3000 ppm or less, and more preferably 500 ppm or more and 1000 ppm or less. That the water content is 3000 ppm or less is preferable in that the effect of improving the storage stability by adjusting the molar ratio is sufficiently achieved. That the water content is 1000 ppm or less is more preferable in that the viscosity change during varnish storage can be suppressed by lowering probability that acid anhydride groups generate by decomposition of amide bonds in polyamic acid molecules and water react and are deactivated. The water content in the solution can be divided into a part of raw material origin and a part of work environment origin. There are various methods for reducing the water content. However, reducing the water content more than necessary by using an extra process or excessive equipment will cause an increase in cost and thus is undesirable. For example, water content of a commercially available amide solvent is about 500 ppm. Trying to reduce the water content below that level will cause an increase in cost and thus is undesirable.

As a way to reduce the water content, it is effective to perform strict raw material storage to avoid moisture contamination and to replace reaction atmosphere with dry air, dry nitrogen or the like. Further, it is also possible to perform processing under a reduced pressure.

<Relation Between Molar Ratio Obtained by Dividing Total Number of Moles of Aromatic Tetracarboxylic Acid Dianhydride by Total Number of Moles of Aromatic Diamine and Water Content of Alkoxysilane-Modified Polyamic Acid Solution>

A preferred value of the molar ratio obtained by dividing the total number of moles of aromatic tetracarboxylic acid dianhydride by the total number of moles of aromatic diamine can also be varied depending on a relation with the water content of the alkoxysilane-modified polyamic acid solution.

For example, from a point of view that a polyamic acid solution superior in storage stability can be obtained as compared to a polyamic acid solution containing about the same water content and having the above molar ratio of 1.000 or more, it is preferable that the molar ratio be 0.9975 or less the water content be 2500 ppm or less, and it is more preferable that the molar ratio be 0.9975 or less and the water content be 2200 ppm or less. Further, from the above point of view, the molar ratio is more preferably 0.9950 or less, and particularly preferably 0.9901 or less.

<Casting and Thermal Imidization of Alkoxysilane-Modified Polyamic Acid Solution>

A laminate including a polyimide film and an inorganic substrate can be manufactured by casting and thermally imidizing the above-described alkoxysilane-modified polyamic acid solution on the inorganic substrate. The laminate can also be considered as a laminate obtained by laminating a polyimide film obtained from the alkoxysilane-modified polyamic acid solution on an inorganic substrate.

As the inorganic substrate, a glass substrate and various metal substrates can be adopted, but a glass substrate is preferable. As a material of the glass substrate, soda-lime glass, borosilicate glass, alkali-free glass, and the like are used. In particular, since alkali-free glass is commonly used in a manufacturing process of thin film transistors, alkali-free glass is more preferable as a material of the inorganic substrate. it is preferable that an adopted inorganic substrate have a thickness of 0.4-5.0 mm. That the thickness of the inorganic substrate is 0.4 mm or more is preferable in that handling of the inorganic substrate becomes easy. That the thickness of the inorganic substrate is 5.0 mm or less is preferable in that a heat capacity of the inorganic substrate is reduced and productivity of a heating or cooling process is improved.

As a casting method of the solution, a commonly known method can be used. Examples of commonly known casting methods include a gravure coating method, a spin coating method, a silk screen method, a dip coating method, a bar coating method, a knife coating method, a roll coating method, a die coating method, and the like.

As the alkoxysilane-modified polyamic acid solution, the above-described reaction solution may be used as is, or a solvent may be removed or added as necessary. In addition to N,N-dimethylformamide, N,N-dimethylacetamide and N-methyl-2-pyrrolidone, examples of a solvent that can be used in the polyimide precursor solution (that is, the alkoxysilane-modified polyamic acid solution) include dimethylsulfoxide, hexamethylphosphoric acid triamide (HMPA), acetonitrile, acetone, and tetrahydrofuran. Further, as auxiliary solvents, xylene, toluene, benzene, diethylene glycol ethyl ether, diethylene glycol dimethyl ether, 1, 2-bis-(2-methoxyethoxy) ethane, bis(2-methoxyethyl) ether, butyl cellosolve, butyl cellosolve acetate, propylene glycol methyl ether, and propylene glycol methyl ether acetate may be used in combination.

An imidization catalyst and/or inorganic fine particles and the like may be added as necessary to the polyimide precursor solution.

It is preferable that tertiary amine be used as the imidization catalyst. It is more preferable that heterocyclic tertiary amine be used as the tertiary amine. Preferable specific examples of the heterocyclic tertiary amine include pyridine, 2, 5-diethylpyridine, picoline, quinoline, isoquinoline, and the like. An amount of the imidization catalyst to be used is preferably 0.01-2.00 equivalents, and particularly preferably 0.02-1.20 equivalents, with respect to a reaction site of the polyimide precursor (that is, the alkoxysilane-modified polyamic acid). That the imidization catalyst is 0.01 equivalents or more is preferable in that an effect of the catalyst can be sufficiently obtained. That the imidization catalyst is 2.00 equivalents or less is preferable from a point of view of cost since a ratio of the catalyst not participating in a reaction is small.

Examples of the inorganic fine particles include inorganic oxide powder such as fine-particle silicon dioxide (silica) powder and aluminum oxide powder, and inorganic salt powders such as fine-particle calcium carbonate powder and calcium phosphate powder. In the field of the present invention, coarse grains of these inorganic fine particles may cause a defect in a subsequent process and thus it is preferable that these inorganic fine particles be uniformly dispersed.

The thermal imidization is a method in which an imidization reaction is caused to proceed by heating alone without applying a dehydrating ring closure agent or the like. In this case, heating temperature and heating time can be determined as appropriate, for example, as follows. First, in order to vaporize the solvent, heating is performed at a temperature of 100-200° C. for 3-120 minutes. Heating can be performed under air, under reduced pressure or in an inert gas such as nitrogen. Further, as a heating device, a commonly known device such as a hot air oven, an infrared oven, a vacuum oven, a hot plate or the like can be used. Next, in order for imidization to further proceed, heating is performed at a temperature of 200 to 500° C. for 3-300 minutes. In this case, a heating condition is preferably to gradually raise temperature from a low temperature to a high temperature. Further, it is preferable that a maximum temperature be in a range of 300-500° C. That the maximum temperature is 300° C. or more is preferable in that thermal imidization is likely to proceed and mechanical characteristics of the obtained polyimide film are improved. That the maximum temperature is 500° C. or less is preferable in that thermal deterioration of polyimide does not proceed and characteristics are not deteriorated.

In the case of using a conventional polyamic acid solution, depending on the kind and the thickness of the polyamic acid, the kind and a surface condition of the inorganic substrate, a heating condition and a heating method, during a heat treatment, the polyimide film is likely to spontaneously peel off from the inorganic substrate. However, when the alkoxysilane-modified polyamic acid solution is used, spontaneous peeling is suppressed and thus a process window can be widely expanded.

It is preferable that the thickness of the polyimide film be 5-50 μm. When the thickness of the polyimide film is 5 μm or more, a required mechanical strength for a substrate film can be ensured. Further, when the thickness of the polyimide film is 50 μm or less, the laminate of the polyimide film and the inorganic substrate can be obtained without spontaneous peeling by only adjusting a heating condition.

That the thickness of the polyimide film is 5 μm or more is preferable in that a required mechanical strength for a substrate film can be ensured. That the thickness of the polyimide film is 50 μm or less is preferable in that the above-described spontaneous peeling or the like is suppressed and a stable laminate is obtained. The laminate obtained by the present invention is excellent in storage stability and process consistency and can be suitably used for manufacturing a flexible device using a commonly known thin film transistor process for a liquid crystal panel.

In this way, by casting and thermally imidizing the polyimide precursor solution and the inorganic substrate, and by selecting a specific structure for a polyamic acid skeleton, the laminate having the polyimide film, which has a linear expansion coefficient of 1-10 ppm/° C., and the inorganic substrate can be obtained. And, by using this laminate, a flexible device having excellent characteristics can be obtained.

<Formation of Electronic Element and Peeling of Polyimide Film from Inorganic Substrate>

By using this laminate of the present invention, a flexible device having excellent characteristics can be obtained. That is, a flexible device can be obtained by forming an electronic element on the polyimide film of the laminate of the present invention and thereafter peeling the polyimide film from the inorganic substrate. Further, the above process has an advantage that an existing production apparatus using an inorganic substrate can be used as is, and can be effectively used in the field of electronic devices such as flat panel displays and electronic papers and is also suitable for mass production.

As a method for peeling the polyimide film from the inorganic substrate, a commonly known method can be used. For example, peeling may be performed by hand or using a mechanical device such as a drive roll or a robot. Further, it is also possible to adopt a method in which a release layer is provided between the inorganic substrate and the polyimide film. Further, for example, it is also possible to adopt a method in which a silicon oxide film is formed on an inorganic substrate having a large number of grooves and peeling is performed by infiltrating an etching solution, and a method in which an amorphous silicon layer is provided on an inorganic substrate and separation is performed using laser light.

In the flexible device of the present invention, the polyimide film has excellent heat resistance and a low linear expansion coefficient. Further, the flexible device of the present invention is not only excellent in lightweight and in impact resistance, but also has excellent characteristics such as that warpage is improved. In particular, with regard to warpage, by adopting a method in which a polyimide film having a low linear expansion coefficient similar to that of an inorganic substrate is directly cast and laminated on the inorganic substrate, a flexible device in which warpage is improved can be obtained.

EXAMPLES

In the following, the present invention is specifically described based on examples. However, the present invention is not limited by these examples, and modifications of embodiments are possible within a scope without departing from the spirit of the present invention.

(Evaluation Methods of Characteristics)
(Water Content)

Water content in a solution was measured using a volumetric titration Karl Fischer water content analyzer, 890 Titrando (manufactured by Metrohm Japan) according to a volumetric titration method of JIS K0068. However, when resin precipitated in a titration solvent, a 1:4 mixed solution of Aquamicron GEX (manufactured by Mitsubishi Chemical Co., Ltd.) and N-methylpyrrolidone was used as a titration solvent.

(Viscosity)

Viscosity was measured using a viscometer RE-215/U (manufactured by Toki Sangyo Co., Ltd.) according to JIS K7117-2: 1999. An attached thermostatic bath was set to 23.0° C. and a measurement temperature was always kept constant.

(Linear Expansion Coefficient)

The linear expansion coefficient was evaluated by thermomechanical analysis using a tensile load method using TMA/SS 120CU manufactured by SII NanoTechnology Co., Ltd. A polyimide film of each example was peeled off from a glass substrate, which is an inorganic substrate, to prepare a sample of 10 mm×3 mm. A load of 3.0 g was applied to a long side of the sample, and the sample was heated to 500° C. or more to remove a residual stress. Thereafter, the sample was heated again at a rate of temperature increase of 10° C./minute and measurement was performed. In this case, an amount of change in strain of the sample per unit temperature in a range of 100° C.-300° C. was taken as the linear expansion coefficient.

Reference Example 1

(1-1) Preparation of Polyamic Acid Solution 850.0 g of N, N-dimethylacetamide (DMAc) dehydrated using a molecular sieve was put into a glass separable flask having a capacity of 2 L equipped with a stirrer, a stirring blade and a nitrogen inlet tube, the stirrer having a polytetrafluoroethylene sealing plug. 40.31 g of p-phenylenediamine (PDA) was added. The resulting solution was stirred for 30 minutes under a nitrogen atmosphere while being heated to 50.0° C. in an oil bath. After confirming that the raw material was uniformly dissolved, 109.41 g of 3,3',4,4'-biphenyl-tetracarboxylic acid dianhydride (BPDA) was added. The temperature of the solution was adjusted to about 80° C. while stirring under a nitrogen atmosphere for 10 minutes until the raw material was completely dissolved. Further, while heating at a constant temperature, stirring was continued for 3 hours to lower the viscosity. 153.8 g of DMAc was further added and stirred. A viscous polyamic acid solution having a viscosity of 25000 mPa·s at 23° C. was obtained. A feed concentration of aromatic diamine and aromatic tetracarboxylic acid dianhydride in this reaction solution is 15 wt % with respect to the total reaction solution, and a molar ratio obtained by dividing the total number of moles of aromatic tetracarboxylic acid dianhydride by the total number of moles of aromatic diamine is 0.9975.

(1-2) Modification by Alkoxysilane Compound Containing Amino Group

The polyamic acid solution was quickly cooled in a water bath, and the temperature of the polyamic acid solution was adjusted to about 50° C. Next, 7.50 g of 1% DMAc solution of 3-aminopropyltriethoxysilane (γ-APS) was added to the polyamic acid solution and stirred. Since the viscosity had ceased to change from 23000 mPa·s, the reaction was completed after 5 hours, and the polyamic acid solution was diluted with DMAc until the viscosity became easy to work with. In this way, an alkoxysilane-modified polyamic acid solution having a viscosity of 13700 mPa·s at 23° C. and a water content of 1400 ppm was obtained. A mixing ratio (additive amount) of the alkoxysilane compound (γ-APS) in this reaction is 0.050 parts by weight with respect to 100 parts by weight of the polyamic acid.

The obtained solution was stored in a sealed glass bottle in an environment of 23° C. and 55% RH for one week, and the viscosity was measured again to be 12400 mPa·s (−9%).

(1-3) Casting and Thermal Imidization of Polyimide Precursor

The obtained alkoxysilane-modified polyamic acid solution was cast on a square alkali-free glass plate (Eagle XG manufactured by Corning Incorporated) with 150 mm sides and a 0.7 mm thickness commonly used as a glass substrate for FPD, using a bar coater such that a dry thickness became 20 μm, and was dried in a hot air oven at 80° C. for 20 minutes, and was subsequently dried at 150° C. for 30 minutes. Further, heating was performed for 30 minutes at 220° C., 30 minutes at 300° C., 1 hour at 430° C., and 1 hour at 500° C. Temperature was gradually raised at a rate of 2° C./min between these temperatures. By performing thermal imidization at high temperatures, a laminate of a polyimide film having a thickness of 19 μm and the alkali-free glass plate was obtained. The polyimide film and the alkali-free glass plate had a moderate peel strength and spontaneous peeling during heating did not occur. However, it was possible to peel off the polyimide film from the alkali-free glass plate. Characteristics of the obtained polyimide film are shown in Table 1.

Reference Example 2

An alkoxysilane-modified polyamic acid solution was obtained in the same manner as in Reference Example 1 except that the additive amount of the 1% DMAc solution of the γ-APS was changed to 1.50 g. The additive amount of the γ-APS in this reaction is 0.010 parts by weight with respect to 100 parts by weight of the polyamic acid. The obtained solution had a viscosity of 13100 mPa·s at 23° C. and a water content of 2800 ppm. Further, using the same method as in Reference Example 1, a laminate of a polyimide film having a thickness of 20 μm and an alkali-free glass plate was obtained without spontaneous peeling. Viscosity change and characteristics of the polyimide film during storage are shown in Tables 1 and 2.

Reference Example 3

850.0 g of dehydrated DMAc was put in an experimental device same as that in Reference Example 1, and 40.39 g of PDA was added. The resulting solution was stirred for 30 minutes under a nitrogen atmosphere while being heated to 50.0° C. in an oil bath. After confirming that the raw material was uniformly dissolved, 109.34 g of BPDA was added. The temperature of the solution was adjusted to about 80° C. while stirring under a nitrogen atmosphere for 10 minutes until the raw material was completely dissolved. Further, while heating at a constant temperature, stirring was continued for 5 hours to lower the viscosity. A viscous polyamic acid solution having a viscosity of 25300 mPa·s at 23° C. was obtained. A feed concentration of aromatic diamine and aromatic tetracarboxylic acid dianhydride in this polyamic acid solution is 15 wt % with respect to the total reaction solution, and a molar ratio obtained by dividing the total number of moles of aromatic tetracarboxylic acid dianhydride by the total number of moles of aromatic diamine is 0.9950.

Further, the polyamic acid solution was quickly cooled in a water bath, and the temperature of the polyamic acid solution was adjusted to about 50° C. Next, 7.50 g of 1% DMAc solution of γ-APS was added to the polyamic acid solution and stirred. Since the viscosity had ceased to change from 19100 mPa·s, the reaction was completed after 5 hours, and the polyamic acid solution was diluted with DMAc until the viscosity became easy to work with. In this way, an alkoxysilane-modified polyamic acid solution having a viscosity of 13800 mPa·s at 23° C. and a water content of 1900 ppm was obtained. The additive amount of the γ-APS in this reaction is 0.050 parts by weight with respect to 100 parts by weight of the polyamic acid. Further, using the same method as in Reference Example 1, a laminate of a polyimide film having a thickness of 22 μm and an alkali-free glass plate was obtained without spontaneous peeling. Viscosity change and characteristics of the polyimide film during storage are shown in Tables 1 and 2.

Reference Example 4

An alkoxysilane-modified polyamic acid solution was obtained in the same manner as in Reference Example 1 except that DMAc having a different water content was used. The obtained solution had a viscosity of 14200 mPa·s at 23° C. and a water content of 2500 ppm. Viscosity change during storage is shown in Table 1.

Reference Example 5

The alkoxysilane-modified polyamic acid solution obtained in the same way as Reference Example 1 was pressurized with dry nitrogen and filtered with a capsule filter DFA HDC2 (rated filtration accuracy 1.2 μm) manufactured by Nippon Pall Co., Ltd. After the filtration operation, the solution left unfiltered had a viscosity of 12700 mPa·s at 23° C. and a water content of 2700 ppm. Viscosity change during storage is shown in Table 1.

Reference Example 6

The alkoxysilane-modified polyamic acid solution obtained in the same way as Reference Example 1 was pressurized with dry nitrogen and filtered with a capsule filter DFA HDC2 (rated filtration accuracy 1.2 μm) manufactured by Nippon Pall Co., Ltd. The filtrated solution had a viscosity of 12000 mPa·s at 23° C. and a water content of 3300 ppm. Viscosity change during storage is shown in Table 1.

Reference Example 7

The alkoxysilane-modified polyamic acid solution obtained in the same manner as in Reference Example 1 was put in an opened state for 60 minutes under the atmosphere, and then was uniformly stirred. The obtained solution had absorbed moisture and had a viscosity of 12100 mPa·s at 23° C. and a water content of 4400 ppm. Viscosity change during storage of this solution is shown in Table 1.

Reference Example 8

Water corresponding to 0.3 wt % relative to the solution obtained in Reference Example 4 was added to the solution. The obtained solution had a viscosity of 13800 mPa·s at 23° C. and a water content of 4900 ppm. Viscosity change during storage is shown in Table 1.

Reference Example 9

850.0 g of dehydrated DMAc was put in an experimental device same as that in Reference Example 1, and 40.34 g of PDA was added. The resulting solution was stirred for 30 minutes under a nitrogen atmosphere while being heated to 50.0° C. in an oil bath. After confirming that the raw material was uniformly dissolved, 109.66 g of BPDA was added. The temperature of the solution was adjusted to about 90° C. while stirring under a nitrogen atmosphere for 10 minutes until the raw material was completely dissolved. Further, while heating at a constant temperature, stirring was continued to lower the viscosity. A viscous polyamic acid solution having a viscosity of 35500 mPa·s at 23° C. was obtained. A feed concentration of aromatic diamine and aromatic tetracarboxylic acid dianhydride in this reaction solution is 15 wt % with respect to the total reaction solution, and a molar ratio obtained by dividing the total number of moles of aromatic tetracarboxylic acid dianhydride by the total number of moles of aromatic diamine is 0.9991.

The reaction solution was quickly cooled in a water bath, and the temperature of the solution was adjusted to about 50° C. Next, 7.50 g of 1% DMAc solution of γ-APS was added to the polyamic acid solution and stirred. Since the viscosity had ceased to change, the reaction was completed in 3 hours, and the polyamic acid solution was diluted with DMAc until the viscosity became easy to work with. In this way, an alkoxysilane-modified polyamic acid solution having a viscosity of 13500 mPa·s at 23° C. and a water content of 1500 ppm was obtained. The additive amount of the γ-APS in this reaction is 0.050 parts by weight with respect to 100 parts by weight of the polyamic acid. Further, using the same method as in Reference Example 1, a laminate of a polyimide film having a thickness of 20 μm and an alkali-free glass plate was obtained. The polyimide film and the alkali-free glass plate had a moderate peel strength and spontaneous peeling during heating did not occur. However, it was possible to peel off the polyimide film from the alkali-free glass plate. Viscosity change and characteristics of the polyimide film during storage are shown in Tables 1 and 2.

Reference Example 10

850.0 g of dehydrated DMAc was put in an experimental device same as that in Reference Example 1, and 40.61 g of PDA was added. The resulting solution was stirred for 30 minutes under a nitrogen atmosphere while being heated to 50.0° C. in an oil bath. After confirming that the raw material was uniformly dissolved, 109.39 g of BPDA was added. The temperature of the solution was adjusted to about 80° C. while stirring under a nitrogen atmosphere for 10 minutes until the raw material was completely dissolved. Further, while heating at a constant temperature, stirring was continued to lower the viscosity. A viscous polyamic acid solution having a viscosity of 31200 mPa·s at 23° C. was obtained. A feed concentration of aromatic diamine and aromatic tetracarboxylic acid dianhydride in this reaction solution is 15 wt % with respect to the total reaction solution, and a molar ratio obtained by dividing the total number of moles of aromatic tetracarboxylic acid dianhydride by the total number of moles of aromatic diamine is 0.9901.

The reaction solution was quickly cooled in a water bath, and the temperature of the solution was adjusted to about 50° C. Next, 7.50 g of 1% DMAc solution of γ-APS was added to the polyamic acid solution and stirred. Since the viscosity had ceased to change, the reaction was completed in 3 hours, and the polyamic acid solution was diluted with DMAc until the viscosity became easy to work with. In this way, an alkoxysilane-modified polyamic acid solution having a viscosity of 13400 mPa·s at 23° C. and a water content of 1800 ppm was obtained. The additive amount of the γ-APS in this reaction is 0.050 parts by weight with respect to 100 parts by weight of the polyamic acid. Further, using the same method as in Reference Example 1, a laminate of a polyimide film having a thickness of 21 μm and an alkali-free glass plate was obtained. The polyimide film and the alkali-free glass plate had a moderate peel strength and spontaneous peeling during heating did not occur. However, it was possible to peel off the polyimide film from the alkali-free glass plate. Viscosity change and characteristics of the polyimide film during storage are shown in Tables 1 and 2.

Reference Example 11

850.0 g of dehydrated DMAc was put in an experimental device same as that in Reference Example 1, and 40.91 g of PDA was added. The resulting solution was stirred for 30 minutes under a nitrogen atmosphere while being heated to 50.0° C. in an oil bath. After confirming that the raw material was uniformly dissolved, 109.09 g of BPDA was added. The temperature of the solution was adjusted to about 80° C. while stirring under a nitrogen atmosphere for 10 minutes until the raw material was completely dissolved. Further, while heating at a constant temperature, stirring was continued to lower the viscosity. A viscous polyamic acid solution having a viscosity of 6300 mPa·s at 23° C. was obtained. A feed concentration of aromatic diamine and aromatic tetracarboxylic acid dianhydride in this reaction solution is 15 wt % with respect to the total reaction solution, and a molar ratio obtained by dividing the total number of moles of aromatic tetracarboxylic acid dianhydride by the total number of moles of aromatic diamine is 0.9801.

The reaction solution was quickly cooled in a water bath, and the temperature of the solution was adjusted to about 50° C. Next, 7.50 g of 1% DMAc solution of γ-APS was added to the polyamic acid solution and stirred. Since the viscosity had ceased to change, the reaction was completed in 2 hours In this way, an alkoxysilane-modified polyamic acid solution having a viscosity of 6100 mPa·s at 23° C. and a water content of 2200 ppm was obtained. The additive amount of the γ-APS in this reaction is 0.050 parts by weight with respect to 100 parts by weight of the polyamic acid. Further, using the same method as in Reference Example 1, a laminate of a polyimide film having a thickness of 20 μm and an alkali-free glass plate was obtained. The polyimide film and the alkali-free glass plate had a moderate peel strength and spontaneous peeling during heating did not occur. However, it was possible to peel off the polyimide film from the alkali-free glass plate. Viscosity change and characteristics of the polyimide film during storage are shown in Tables 1 and 2.

Example 1

An alkoxysilane-modified polyamic acid solution was obtained in the same manner as in Reference Example 1 except that the additive amount of the 1% DMAc solution of the γ-APS was changed to 13.50 g. The additive amount of the γ-APS in this reaction is 0.090 parts by weight with respect to 100 parts by weight of the polyamic acid. The obtained solution had a viscosity of 13500 mPa·s at 23° C. and a water content of 1700 ppm. Further, using the same method as in Reference Example 1, a laminate of a polyimide film having a thickness of 20 μm and an alkali-free glass plate was obtained without spontaneous peeling. Viscosity change and characteristics of the polyimide film during storage are shown in Tables 1 and 2.

Example 2

An alkoxysilane-modified polyamic acid solution was obtained in the same manner as in Reference Example 1 except that the additive amount of the 1% DMAc solution of the γ-APS was changed to 8.25 g. The additive amount of the γ-APS in this reaction is 0.055 parts by weight with respect to 100 parts by weight of the polyamic acid. The obtained solution had a viscosity of 13200 mPa·s at 23° C. and a water content of 1500 ppm. Further, using the same method as in Reference Example 1, a laminate of a polyimide film having a thickness of 20 µm and an alkali-free glass plate was obtained without spontaneous peeling. Viscosity change and characteristics of the polyimide film during storage are shown in Tables 1 and 2.

Comparative Example 1

A polyamic acid solution was obtained in the same manner as in Reference Example 1. Thereafter, without adding γ-APS, the polyamic acid solution was diluted with DMAc until the viscosity became easy to work with, and an alkoxysilane-modified polyamic acid solution having a viscosity of 13600 mPa·s and a water content of 1100 ppm was obtained. Similar to Reference Example 1, the obtained solution was cast and imidized on an alkali-free glass. However, during thermal imidization, air bubbles were generated between the polyimide film and the alkali-free glass plate, and only a laminate of the polyimide film, a portion of which was peeled off, and the alkali-free glass plate could be obtained. Characteristics of the obtained polyimide film are shown in Table 2.

Comparative Example 2

850.0 g of dehydrated DMAc was put in a reaction container same as that in Reference Example 1, and 110.08 g of BPDA was added and dispersed by stirring. 40.17 g of PDA was gradually added over about 30 minutes while the dispersed solution was heated to 50.0° C. in an oil bath. Stirring was continued for 1 hour until the raw material was completely dissolved and the viscosity became constant. Further, 250 g of DMAc was added and stirred, and a viscous polyamic acid solution having a viscosity of 20100 mPa·s was obtained. A feed concentration of aromatic diamine and aromatic tetracarboxylic acid dianhydride in this reaction solution is 15 wt % with respect to the total reaction solution, and a molar ratio obtained by dividing the total number of moles of aromatic tetracarboxylic acid dianhydride by the total number of moles of aromatic diamine is 1.0070.

Further, the reaction solution was quickly cooled in a water bath, and the temperature of the solution was adjusted to about 50° C. Next, 7.50 g of 1% DMAc solution of γ-APS was added to the polyamic acid solution and stirred. Since the viscosity had ceased to change from 19100 mPa·s, the reaction was completed after 5 hours, and the polyamic acid solution was diluted with DMAc until the viscosity became easy to work with. In this way, an alkoxysilane-modified polyamic acid solution having a viscosity of 13600 mPa·s at 23° C. and a water content of 1400 ppm was obtained. The additive amount of the γ-APS in this reaction is 0.050 parts by weight with respect to 100 parts by weight of the polyamic acid. Further, using the same method as in Reference Example 1, a laminate of a polyimide film and an alkali-free glass plate was obtained without spontaneous peeling. Viscosity change and characteristics of the polyimide film during storage are shown in Tables 1 and 2.

Comparative Example 3

Water corresponding to 0.1 wt % relative to the solution obtained in Comparative Example 2 was added to the solution. The obtained solution had a viscosity of 13300 mPa·s at 23° C. and a water content of 2600 ppm. Viscosity change during storage is shown in Table 1.

Comparative Example 4

Water corresponding to 0.3 wt % relative to the solution obtained in Comparative Example 2 was added to the solution. The obtained solution had a viscosity of 13300 mPa·s at 23° C. and a water content of 4800 ppm. Viscosity change during storage is shown in Table 1.

In the following Table 1, Reference Examples 1-11 and Comparative Examples 2-4 are ordered according to the amount of the water content. The viscosity change rate is rounded off to the closest whole number.

TABLE 1

| | (Total Number of Moles of Aromatic Tetracarboxylic Acid Dianhydride)/(Total Number of Moles of Aromatic Diamine) | Silane Coupling Agent | Additive Amount (Parts by Weight) | Water Content (ppm) | Storage Stability at 23° C. and 55% RH | | | |
|---|---|---|---|---|---|---|---|---|
| | | | | | Initial Viscosity (mPa·s) | Viscosity after one Week (mPa·s) | Viscosity Change Rate (%) | Overall Evaluation |
| Reference Example 1 | 0.9975 | γ-APS | 0.050 | 1400 | 13700 | 12400 | −9 | B |
| Comparative Example 2 | 1.0070 | γ-APS | 0.050 | 1400 | 13600 | 11200 | −18 | — |
| Reference Example 9 | 0.9991 | γ-APS | 0.050 | 1500 | 13500 | 12200 | −10 | C |
| Reference Example 10 | 0.9901 | γ-APS | 0.050 | 1800 | 13400 | 12500 | −7 | A |
| Reference Example 3 | 0.9950 | γ-APS | 0.050 | 1900 | 13800 | 12700 | −8 | B |
| Reference Example 11 | 0.9801 | γ-APS | 0.050 | 2200 | 6100 | 5700 | −7 | A |
| Reference Example 4 | 0.9975 | γ-APS | 0.050 | 2500 | 14200 | 12500 | −12 | C |
| Comparative Example 3 | 1.0070 | γ-APS | 0.050 | 2600 | 13300 | 10200 | −23 | — |
| Reference Example 5 | 0.9975 | γ-APS | 0.050 | 2700 | 12700 | 10400 | −18 | E |
| Reference Example 2 | 0.9975 | γ-APS | 0.010 | 2800 | 13100 | 11600 | −11 | B |

TABLE 1-continued

| | (Total Number of Moles of Aromatic Tetracarboxylic Acid Dianhydride)/(Total Number of Moles of Aromatic Diamine) | Silane Coupling Agent | Additive Amount (Parts by Weight) | Water Content (ppm) | Storage Stability at 23° C. and 55% RH | | | Overall Evaluation |
|---|---|---|---|---|---|---|---|---|
| | | | | | Initial Viscosity (mPa·s) | Viscosity after one Week (mPa·s) | Viscosity Change Rate (%) | |
| Reference Example 6 | 0.9975 | γ-APS | 0.050 | 3300 | 12000 | 10000 | −17 | E |
| Reference Example 7 | 0.9975 | γ-APS | 0.050 | 4400 | 12100 | 9900 | −18 | C |
| Comparative Example 4 | 1.0070 | γ-APS | 0.050 | 4800 | 13300 | 8600 | −35 | — |
| Reference Example 8 | 0.9975 | γ-APS | 0.050 | 4900 | 13800 | 10600 | −23 | D |
| Example 1 | 0.9975 | γ-APS | 0.090 | 1700 | 13500 | 13400 | −1 | A |
| Example 2 | 0.9975 | γ-APS | 0.055 | 1500 | 13200 | 12400 | −7 | A |

Results of evaluating adhesion of the polyimide films obtained from the respective solutions to the respective alkali-free glass plates and results of evaluating the linear expansion coefficients of the polyimide films are shown in Table 2. Regarding adhesion, based on visual inspection, "○" was used to indicate a case where there was no void between the polyimide film and the alkali-free glass plate and the polyimide film had a uniform appearance, and "x" was used to indicate a case where there was a gap between the polyimide film and the alkali-free glass plate or air bubbles or the like occurred inside the polyimide film.

TABLE 2

| | (Total Number of Moles of Aromatic Tetracarboxylic Acid Dianhydride)/(Total Number of Moles of Aromatic Diamine) | Silane Coupling Agent | Additive Amount (Parts by Weight) | Thickness (μm) | Adhesion | Linear Expansion Coefficient (ppm/°C.) |
|---|---|---|---|---|---|---|
| Reference Example 1 | 0.9975 | γ-APS | 0.050 | 19 | ○ | 8 |
| Reference Example 2 | 0.9975 | γ-APS | 0.010 | 20 | ○ | 8 |
| Reference Example 3 | 0.9950 | γ-APS | 0.050 | 22 | ○ | 7 |
| Reference Example 9 | 0.9991 | γ-APS | 0.050 | 20 | ○ | 6 |
| Reference Example 10 | 0.9901 | γ-APS | 0.050 | 21 | ○ | 8 |
| Reference Example 11 | 0.9801 | γ-APS | 0.050 | 20 | ○ | 8 |
| Comparative Example 1 | 0.9975 | None | — | 18 | X | 7 |
| Comparative Example 2 | 1.0007 | γ-APS | 0.050 | 21 | ○ | 8 |
| Example 1 | 0.9975 | γ-APS | 0.090 | 20 | ○ | 7 |
| Example 2 | 0.9975 | γ-APS | 0.055 | 20 | ○ | 7 |

The more the water content in a solution, the more the storage stability of the solution deteriorates and the more the viscosity of the solution decreases. However, when the water content is the same, the viscosity change can be reduced by the method of the present invention.

In Reference Examples 1-11, there is a tendency that when the water content increases, the viscosity decreases more. Further, in Comparative Examples 2-4, when the water content increases, the viscosity decreases more. In particular, as compared to Reference Example 9, the viscosity changes in Reference Examples 1, 3, 10 are smaller. In Reference Examples 1, 3, 9, 10, the water content is about the same as that in Comparative Example 2, but the viscosity change rate is smaller. Similarly, in Reference Examples 2, 4, 5, 6, 11, the water content is about the same as that in Comparative Example 3, but the viscosity change rate is smaller. Further, also in Reference Examples 7, 8, the water content is about the same as that in Comparative Example 4, but the viscosity change rate is smaller. For example, the water content in each of Reference Examples 5, 6 is about 3000 ppm, which is about twice the water content of 1400 ppm in Comparative Example 2. However, despite this difference in the water content, the viscosity change rates in Reference Examples 5, 6 and Comparative Example 2 are about the same.

These results are evaluated using A-E and are shown in an Overall Evaluation column of Table 1. Evaluation criteria were as follows.
A: A value obtained by dividing the viscosity change rate by the viscosity change rate of a comparative example of similar water content is 0.4 or less.
B: A value obtained by dividing the viscosity change rate by the viscosity change rate of a comparative example of similar water content is greater than 0.4 and equal to or less than 0.5.
C: A value obtained by dividing the viscosity change rate by the viscosity change rate of a comparative example of similar water content is greater than 0.5 and equal to or less than 0.6.

D: A value obtained by dividing the viscosity change rate by the viscosity change rate of a comparative example of similar water content is greater than 0.6 and equal to or less than 0.7.

E: A value obtained by dividing the viscosity change rate by the viscosity change rate of a comparative example of similar water content is greater than 0.7.

Here, when the overall evaluation of a comparative example is it indicates that the comparative example is a reference that a reference example or an example is compared to in the overall evaluation.

"A comparative example of similar water content" with respect to an example or a reference example (to be referred to as Example (α) or Reference Example (α)) refers to a comparative example, among Comparative Examples 2-4, that has the smallest absolute value of a difference in water content as compared to Example (α) or Reference Example (α). For example, in the case of Reference Example 6, the absolute value of the difference in water content as compared to Comparative Example 2 is 1900; the absolute value of the difference in water content as compared to Comparative Example 3 is 700; and the absolute value of the difference in water content as compared to Comparative Example 4 is 1500. Therefore Reference Example 6 is evaluated by comparing with Comparative Example 3.

Specifically, in the overall evaluation, Reference Examples 1, 3, 9 and 10 were compared with Comparative Example 2 having similar water content. Reference Examples 2, 4-6 and 11 were compared with Comparative Example 3 having similar water content. Reference Examples 7 and 8 were compared with Comparative Example 4 having similar water content.

The results of the overall evaluation are discussed as follows. When the molar ratio obtained by dividing the total number of moles of aromatic tetracarboxylic acid dianhydride by the total number of moles of aromatic diamine (hereinafter also simply referred to as the molar ratio) is 0.9950 or less (Reference Examples 3, 10 and 11), the overall evaluation is A or B. In particular, when the molar ratio is 0.9901 or less (Reference Examples 10 and 11), the overall evaluation is A.

When the molar ratio is 0.9975 or less and the water content is 2500 or less (Reference Examples 1, 3, 4, 10 and 11), the overall evaluation is A, B or C. Further, when the molar ratio is 0.9975 or less and the water content is 2200 or less (Reference Examples 1, 3, 10 and 11), the overall evaluation is A or B.

In the overall evaluation, Examples 1 and 2 are compared with Comparative Example 2 having similar water content. As a result, the overall evaluation for Examples 1 and 2 is A. From this, it is clear that when the additive amount of the alkoxysilane compound containing an amino group exceeds 0.050 parts by weight and is less than 0.100 parts by weight, the viscosity change rate can be suppressed.

Further, even when the polyimide film of each of Reference Examples 1-3, 9-11 had a dry thickness of about 20 μm, air bubbles were not generated between the polyimide film and the alkali-free glass plate, and a laminate of the polyimide film and the alkali-free glass plate was obtained. In contrast, even when the polyimide film of Comparative Example 1 had a dry thickness of about 20 μm, air bubbles were generated between the polyimide film and the alkali-free glass plate, and a laminate of the polyimide film and the alkali-free glass plate could not be obtained.

Further, the polyimide films of Reference Examples 1-3, 9-11 and Comparative Example 2 did not curl or warp even after being peeled off from the alkali-free glass plates. This is because the linear expansion coefficients of these polyimide films are 6-8 ppm/° C., which are close to the linear expansion coefficient of the alkali-free glass plates.

Similarly, even when the polyimide film of each of Examples 1 and 2 had a dry thickness of about 20 μm, air bubbles were not generated between the polyimide film and the alkali-free glass plate, and a laminate of the polyimide film and the alkali-free glass plate was obtained.

Further, the polyimide films of Examples 1 and 2 did not curl or warp even after being peeled off from the alkali-free glass plates. This is because the linear expansion coefficients of these polyimide films are 6-8 ppm/° C., which are close to the linear expansion coefficient of the alkali-free glass plates.

INDUSTRIAL APPLICABILITY

As described above, according to the present invention, it is possible to provide a polyamic acid solution that can be formed into a film without peeling even when the film is thick and can be stably stored at room temperature, and to provide a laminate of a polyimide film and an inorganic substrate that can be suitably used for production of a flexible device.

Therefore, the present invention can be suitably used, for example, in the field of electronic devices such as flat panel displays and electronic papers.

What is claimed is:

1. An alkoxysilane-modified polyamic acid solution obtained by reacting an alkoxysilane compound and a polyamic acid in a solution with stirring at 50° C. to 80° C. for 2 to 5 hours, wherein the alkoxysilane compound comprises an amino group,
wherein
   the polyamic acid is obtained by reacting an aromatic diamine and an aromatic tetracarboxylic acid dianhydride in a solvent,
   a molar ratio obtained by dividing a total number of moles of the aromatic tetracarboxylic acid dianhydride by a total number of moles of the aromatic diamine is 0.980 or more and 0.9995 or less, and,
   when an amount of the polyamic acid contained in the alkoxysilane-modified polyamic acid solution is 100 parts by weight, an additive amount of the alkoxysilane compound is more than 0.050 parts by weight and less than 0.100 parts by weight.

2. The alkoxysilane-modified polyamic acid solution according to claim 1, wherein
the aromatic tetracarboxylic acid dianhydride is 3,3',4,4'-biphenyl-tetracarboxylic acid dianhydride, and
the aromatic diamine is an aromatic diamine represented by the following Formula (1):

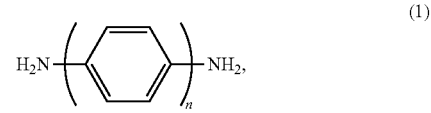

wherein n is an integer of 1 to 3.

3. The alkoxysilane-modified polyamic acid solution according to claim 1, wherein a main component of the solvent is an amide solvent.

4. A flexible device comprising:
a polyimide film obtained from the alkoxysilane-modified polyamic acid solution according to claim 1; and
an electronic element formed on the polyimide film.

5. A laminate manufacturing method comprising:
obtaining a laminate by laminating a polyimide film on an inorganic substrate,
wherein the polyimide film is obtained from the alkoxysilane-modified polyamic acid solution according to claim 1 by casting and thermally imidizing the alkoxysilane-modified polyamic acid solution on the inorganic substrate.

6. A flexible device manufacturing method comprising:
forming an electronic element on a polyimide film of a laminate obtained using the laminate manufacturing method according to claim 5; and
peeling the polyimide film, on which the electronic element is formed, from an inorganic substrate of the laminate.

7. A laminate comprising:
a polyimide film that is obtained from the alkoxysilane-modified polyamic acid solution according to claim 1; and
an inorganic substrate on which the polyimide film is laminated,
wherein the polyimide film has a linear expansion coefficient of from 1 to 10 ppm/° C.

8. The laminate according to claim 7,
wherein
the inorganic substrate has a thickness of from 0.4 to 5.0 mm, and
the polyimide film has a thickness of from 10 to 50 μm.

9. An alkoxysilane-modified polyamic acid solution obtained by reacting an alkoxysilane compound and a polyamic acid in a solution with stirring at 50° C. to 80° C. for 2 to 5 hours, wherein the alkoxysilane compound comprises an amino group,
wherein the polyamic acid is obtained by reacting an aromatic diamine and an aromatic tetracarboxylic acid dianhydride in a solvent,
wherein a molar ratio obtained by dividing a total number of moles of the aromatic tetracarboxylic acid dianhydride by a total number of moles of the aromatic diamine is 0.980 or more and 0.9995 or less,
wherein, when an amount of the polyamic acid contained in the alkoxysilane-modified polyamic acid solution is 100 parts by weight, an additive amount of the alkoxysilane compound is more than 0.050 parts by weight and less than 0.100 parts by weight, and
wherein a water content of the alkoxysilane-modified polyamic acid solution is 500 ppm or more and 3000 ppm or less.

10. A method of manufacturing an alkoxysilane-modified polyamic acid solution, the method comprising:
obtaining a polyamic acid by reacting an aromatic diamine and an aromatic tetracarboxylic acid dianhydride in a solvent; and
obtaining an alkoxysilane-modified polyamic acid solution by reacting an alkoxysilane compound and the polyamic acid in a solution with stirring at 50° C. to 80° C. for 2 to 5 hours, wherein the alkoxysilane compound comprises an amino group,
wherein
a molar ratio obtained by dividing a total number of moles of the aromatic tetracarboxylic acid dianhydride by a total number of moles of the aromatic diamine is 0.980 or more and 0.9995 or less, and,
when an amount of the polyamic acid contained in the alkoxysilane-modified polyamic acid solution is 100 parts by weight, an additive amount of the alkoxysilane compound is more than 0.050 parts by weight and less than 0.100 parts by weight.

11. A method of manufacturing an alkoxysilane-modified polyamic acid solution, the method comprising:
obtaining a polyamic acid by reacting an aromatic diamine and an aromatic tetracarboxylic acid dianhydride in a solvent; and
obtaining an alkoxysilane-modified polyamic acid solution by reacting an alkoxysilane compound and the polyamic acid in a solution with stirring at 50° C. to 80° C. for 2 to 5 hours, wherein the alkoxysilane compound comprises an amino group,
wherein a molar ratio obtained by dividing a total number of moles of the aromatic tetracarboxylic acid dianhydride by a total number of moles of the aromatic diamine is 0.980 or more and 0.9995 or less,
wherein, when an amount of the polyamic acid contained in the alkoxysilane-modified polyamic acid solution is 100 parts by weight, an additive amount of the alkoxysilane compound is more than 0.050 parts by weight and less than 0.100 parts by weight, and
wherein a water content of the alkoxysilane-modified polyamic acid solution is 500 ppm or more and 3000 ppm or less.

* * * * *